United States Patent
Tanabe et al.

(10) Patent No.: US 8,835,651 B2
(45) Date of Patent: *Sep. 16, 2014

(54) PHOTOELECTRIC CONVERSION ELEMENT AND DYE FOR PHOTOELECTRIC CONVERSION ELEMENT

(75) Inventors: Junji Tanabe, Tokyo (JP); Atsushi Monden, Tokyo (JP); Masahiro Shinkai, Tokyo (JP); Yohei Aoyama, Tokyo (JP); Kensaku Akimoto, Tokyo (JP); Toru Yano, Tokyo (JP)

(73) Assignee: Adeka Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/577,466

(22) PCT Filed: Dec. 27, 2010

(86) PCT No.: PCT/JP2010/073519
§ 371 (c)(1),
(2), (4) Date: Aug. 7, 2012

(87) PCT Pub. No.: WO2011/104992
PCT Pub. Date: Sep. 1, 2011

(65) Prior Publication Data
US 2012/0305074 A1   Dec. 6, 2012

(30) Foreign Application Priority Data

Feb. 26, 2010  (JP) .................... 2010-043481

(51) Int. Cl.
| | |
|---|---|
| *C07D 209/80* | (2006.01) |
| *C09B 23/08* | (2006.01) |
| *H01G 9/20* | (2006.01) |
| *H01L 51/00* | (2006.01) |
| *H01M 14/00* | (2006.01) |

(52) U.S. Cl.
CPC ........... *H01M 14/005* (2013.01); *C09B 23/086* (2013.01); *H01G 9/2059* (2013.01); *H01L 51/0064* (2013.01); *Y02E 10/542* (2013.01)
USPC ............ 548/420; 548/427; 548/455; 136/263

(58) Field of Classification Search
None
See application file for complete search history.

(56) References Cited
U.S. PATENT DOCUMENTS

| | | | | |
|---|---|---|---|---|
| 7,943,849 | B2 * | 5/2011 | Tanabe et al. ............. | 136/263 |
| 2008/0181965 | A1 * | 7/2008 | Leon et al. ............. | 424/501 |
| 2008/0236663 | A1 | 10/2008 | Tanabe et al. | |

(Continued)

FOREIGN PATENT DOCUMENTS

| | | |
|---|---|---|
| EP | 1 020 881 A2 | 7/2000 |
| EP | 1 293 997 A2 | 3/2003 |

(Continued)

OTHER PUBLICATIONS

Otsuka, Atsuhiro et al., "Design and Synthesis of Near-infrared-active Heptamenthine-Cyanine Dyes to Suppress Aggregation in a Dye-sensitized Porous Zinc Oxide Solar Cell," Chemistry Letters, 2008, vol. 37, No. 2, pp. 176-177.

(Continued)

*Primary Examiner* — Nyeemah A Grazier
(74) *Attorney, Agent, or Firm* — Oliff PLC

(57) ABSTRACT

A photoelectric conversion element includes a working electrode having a dye-supported metal oxide electrode in which a dye is supported on a metal oxide layer, a compound having a structure represented by the following general formula (1): is used as the dye.

[Formula 1]

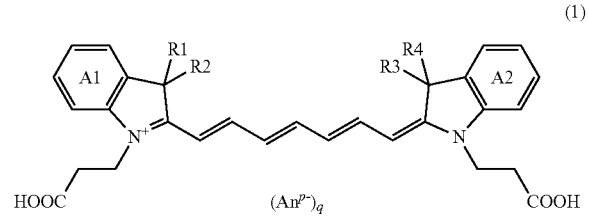

(1)

wherein R1 to R4 are each independently a linear alkyl group having 4 to 20 carbon atoms and may be the same or different; A1 and A2 are each any one selected from the following aromatic ring group A (a pyrrole ring in the formula (1) is represented by an arc a to show a condensation position with the pyrrole ring), may be the same or different, and may have a substituent in an aromatic ring; $An^{p-}$ is a p-valent anion; p is 1 or 2; and q is a coefficient for keeping a charge of the entire dye neutral.

<Aromatic Ring Group A>

[Formula 2]

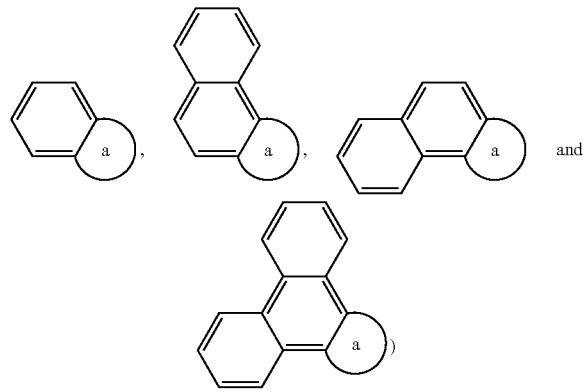

12 Claims, 1 Drawing Sheet

(56) References Cited

U.S. PATENT DOCUMENTS

| | | |
|---|---|---|
| 2009/0053456 A1 | 2/2009 | Nakamura et al. |
| 2011/0155249 A1* | 6/2011 | Tanabe et al. ............ 136/263 |
| 2011/0253218 A1* | 10/2011 | Tanabe et al. ............ 136/263 |

FOREIGN PATENT DOCUMENTS

| | | |
|---|---|---|
| JP | A-2007-220412 | 8/2007 |
| JP | A-2007-276451 | 10/2007 |
| JP | A-2008-71535 | 3/2008 |
| JP | A-2008-166119 | 7/2008 |
| JP | A-2010-003557 | 1/2010 |
| WO | WO 2010/038589 A1 | 4/2010 |

OTHER PUBLICATIONS

Mori, Shogo et al., "Charge-Transfer Processes in Dye-Sensitized NiO Solar Cells," Journal of Physical Chemistry, 2008, vol. 112, pp. 16134-16139.

International Search Report issued in International Patent Application No. PCT/JP2010/073519 dated Mar. 29, 2011.

\* cited by examiner

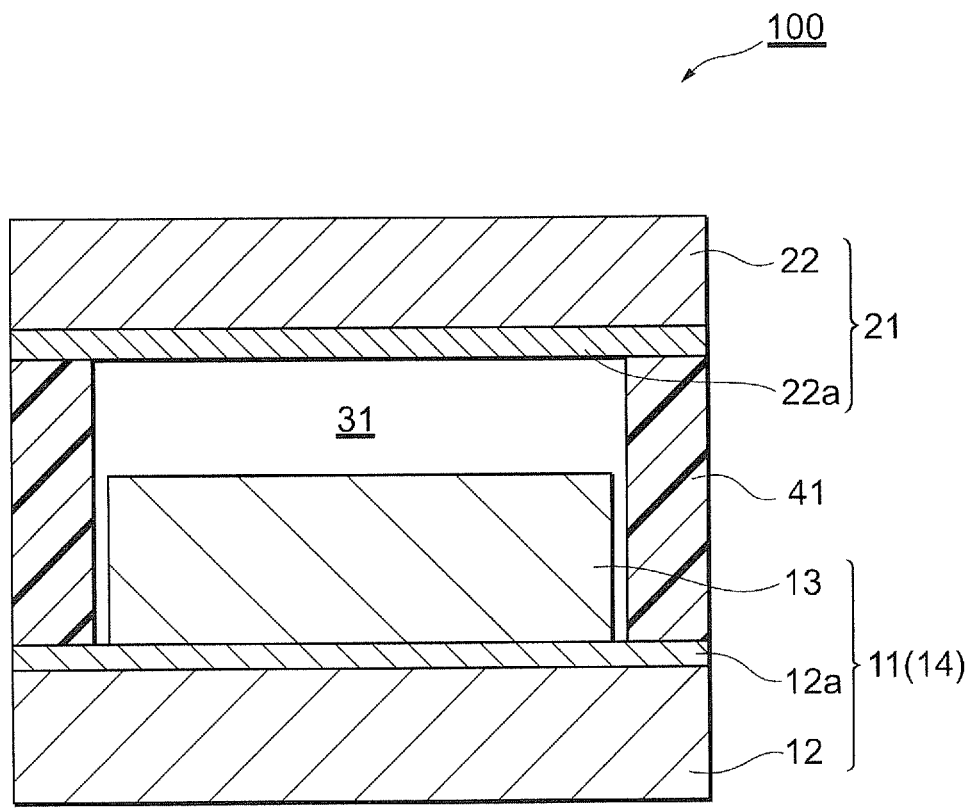

PHOTOELECTRIC CONVERSION ELEMENT AND DYE FOR PHOTOELECTRIC CONVERSION ELEMENT

CROSS-REFERENCES TO RELATED APPLICATIONS

This application relates to and claims priority from Japanese Patent Application No. 2010-043481, filed on Feb. 26, 2010, the entire disclosure of which is incorporated herein by reference.

TECHNICAL FIELD

The present invention relates to a photoelectric conversion element and a dye for a photoelectric conversion element.

BACKGROUND ART

Conventionally, dyes have been widely used in various technical fields. As one example, in the field of photoelectric conversion elements, for example, a dye having photosensitization action is used in the working electrode of a dye-sensitized solar cell.

A dye-sensitized solar cell generally has an electrode having an oxide semiconductor as a support for a dye. Such a dye absorbs incident light and is excited, and this excited dye injects electrons into the support to perform photoelectric conversion. In this type of dye-sensitized solar cell, high energy conversion efficiency can be theoretically expected among organic solar cells. In addition, this type of dye-sensitized solar cell can be produced at lower cost than conventional solar cells using a silicon semiconductor and therefore is considered to be very advantageous in terms of cost.

On the other hand, as dyes used in photoelectric conversion elements, organic dyes, such as ruthenium complex dyes and cyanine dyes, are widely known. Particularly, cyanine dyes have relatively high stability and can easily be synthesized, and therefore, various studies have been made.

For example, Patent Document 1 discloses a cyanine dye that has a structure in which an indolenine skeleton is bonded to both ends of a methine chain skeleton, and further has a carboxylic acid group as an anchor group to be adsorbed on an oxide semiconductor electrode, for the purpose of improving energy conversion efficiency and the like.

In addition, Patent Document 2 discloses a cyanine dye that has a structure in which an indolenine skeleton is bonded to both ends of a heptamethine chain skeleton into which a cyclo-ring is introduced, and further has a carboxylic acid group as an anchor group to be adsorbed on an oxide semiconductor electrode, for the purpose of improving photoelectric conversion characteristics in the near infrared to infrared region.

CITATION LIST

Patent Documents

Patent Document 1: Japanese Patent Laid-Open No. 2008-166119
Patent Document 2: Japanese Patent Laid-Open No. 2007-220412

SUMMARY OF INVENTION

Problem to be Solved by Invention

Currently, for the purpose of further improving photoelectric conversion characteristics, a wider absorption wavelength region is studied, and particularly, the development of dyes having large light absorption intensity in the near infrared to infrared region is required. In addition, with transition to the phase of the practical use of photoelectric conversion elements in recent years, the implementation of not only photoelectric conversion elements simply having excellent energy conversion efficiency, but also those having new added value, for example, photoelectric conversion elements colored in colors, colorless and transparent photoelectric conversion elements, and photoelectric conversion elements that are color-coordinated by arranging a plurality of elements colored in colors in a row, is required.

However, many of dyes used in conventional photoelectric conversion elements, typified by the cyanine dye described in Patent Document 1, and the like, have a maximum absorption wavelength around 450 to 700 nm, have small light absorption intensity in the near infrared to infrared region, and are colored blue to yellow, and therefore, there is a limit to reproducible hues, and it is difficult to create new color variations.

On the other hand, the cyanine dye described in Patent Document 2 has a maximum absorption wavelength around 800 nm and is close to colorless and transparent, but problems of the cyanine dye are that the dye has weak adhesiveness (adsorption properties) to a metal oxide layer and is easily peeled. In addition, the cyanine dye has insufficient energy conversion efficiency as a dye used in a photoelectric conversion element, and further improvement is required.

The present invention has been made in view of such circumstances, and it is an object of the present invention to provide a dye for a photoelectric conversion element and a photoelectric conversion element that have large light absorption intensity in the near infrared to infrared region and excellent adhesiveness (adsorption properties) to a metal oxide layer and thus have excellent photoelectric conversion characteristics. It is a further object of the present invention to provide a dye for a photoelectric conversion element and a photoelectric conversion element that are light green or colorless and transparent.

Means for Solving the Problem

The present inventors have diligently studied over and over and, as a result, found that the above problems are solved by using a cyanine dye having a specific structure newly synthesized by the present inventors, leading to the completion of the present invention.

Specifically, the present invention provides the following <1> to <7>.

<1> A photoelectric conversion element comprising a working electrode having a dye-supported metal oxide electrode having a dye supported on a metal oxide layer, wherein the dye comprises a compound having a structure represented by the following general formula (1):

[Formula 1]

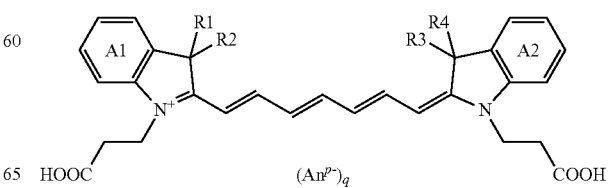

wherein R1 to R4 are each independently a linear alkyl group having 4 to 20 carbon atoms and may be the same or different; A1 and A2 are each any one selected from the following aromatic ring group A (a pyrrole ring in the formula (1) is represented by an arc a to show a condensation position with the pyrrole ring), may be the same or different, and may have a substituent in an aromatic ring; $An^{p-}$ is a p-valent anion; p is 1 or 2; and q is a coefficient for keeping a charge of the entire dye neutral.

<Aromatic Ring Group A>

[Formula 2]

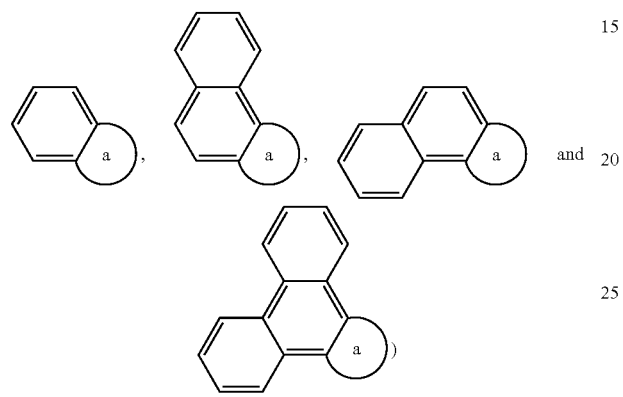

<2> The photoelectric conversion element according to the above <1>, wherein
in the general formula (1), A1 and A2 are each a benzene ring.
<3> The photoelectric conversion element according to the above <1> or <2>, wherein
in the general formula (1), R1 to R4 are each a linear alkyl group having 10 to 20 carbon atoms.
<4> The photoelectric conversion element according to any one of the above <1> to <3>, wherein
the metal oxide layer is substantially composed of zinc oxide.
<5> A dye for a photoelectric conversion element, which has a structure represented by the following general formula (1):

[Formula 3]

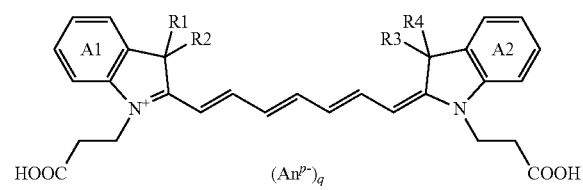

(1)

wherein R1 to R4 are each independently a linear alkyl group having 4 to 20 carbon atoms and may be the same or different; A1 and A2 are each any one selected from the following aromatic ring group A (a pyrrole ring in the formula (1) is represented by an arc a to show a condensation position with the pyrrole ring), may be the same or different, and may have a substituent in an aromatic ring; $An^{p-}$ is a p-valent anion; p is 1 or 2; and q is a coefficient for keeping a charge of the entire dye neutral.

<Aromatic Ring Group A>

[Formula 4]

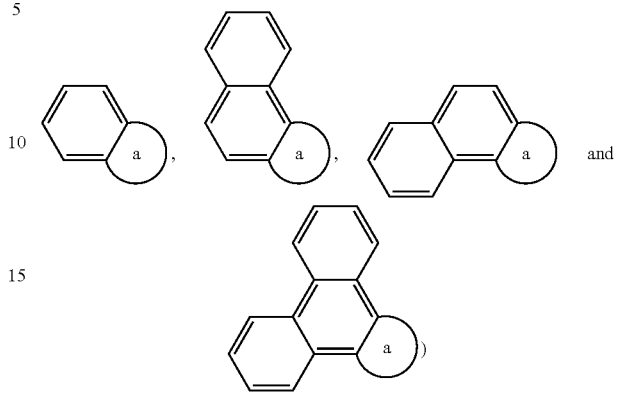

<6> The dye for a photoelectric conversion element according to the above <5>, wherein
in the general formula (1), A1 and A2 are each a benzene ring.
<7> The dye for a photoelectric conversion element according to the above <5> or <6>, wherein
in the general formula (1), R1 to R4 are each a linear alkyl group having 10 to 20 carbon atoms.

Advantageous Effects of Invention

According to the present invention, a dye for a photoelectric conversion element that has large light absorption intensity in the near infrared to infrared region and excellent adhesiveness (adsorption properties) to a metal oxide layer is realized. Therefore, by using this dye for a photoelectric conversion element, a photoelectric conversion element that has enhanced photoelectric conversion characteristics can be realized easily and reliably. Moreover, a photoelectric conversion element that not only has excellent photoelectric conversion characteristics but also is light green or colorless and transparent can also be realized, and therefore new color variations can be created.

BRIEF DESCRIPTION OF DRAWING

FIG. 1 is a cross-sectional view showing a schematic configuration of a dye-sensitized solar cell 100.

DESCRIPTION OF EMBODIMENT

Hereinafter, embodiments of the present invention will be described below. Like numerals refer to like elements, and redundant description is omitted. In addition, positional relationship, such as top, bottom, left, and right, is based on the positional relationship shown in the drawing unless otherwise specified. Further, the dimensional ratio in the drawing is not limited to the ratio shown. In addition, the following embodiment is an illustration for describing the present invention, and the present invention is not limited only to the embodiments.

A dye in this embodiment is used for a photoelectric conversion element, such as a dye-sensitized solar cell, and has a structure represented by general formula (1) (hereinafter also referred to as a "cyanine structure represented by general formula (1)"). A compound having the cyanine structure represented by general formula (1) (hereinafter also referred to as a "cyanine compound in this embodiment") is, for example, a compound that has adsorption properties (bonding properties) on a metal oxide layer (support) comprising a metal oxide semiconductor material, and absorbs light, is excited, and can inject electrons into the support.

[Formula 5]

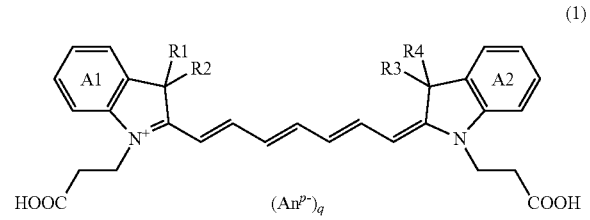

(1)

wherein R1 to R4 are each independently a linear alkyl group having 4 to 20 carbon atoms and may be the same or different; A1 and A2 are each any one selected from the following aromatic ring group A (a pyrrole ring in formula (1) is represented by an arc a to show the condensation position with the pyrrole ring), may be the same or different, and may have a substituent in the aromatic ring; $An^{p-}$ is a p-valent anion; p is 1 or 2; and q is a coefficient for keeping the charge of the entire dye neutral.

<Aromatic Ring Group A>

[Formula 6]

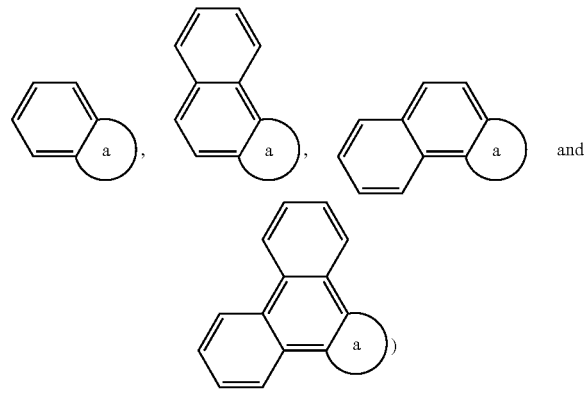

In general formula (1), the linear alkyl group having 4 to 20 carbon atoms means a n-butyl group, a n-pentyl group, a n-hexyl group, a n-heptyl group, a n-octyl group, a n-nonyl group, a n-decyl group, a n-undecyl group, a n-dodecyl group, a n-tridecyl group, a n-tetradecyl group, a n-pentadecyl group, a n-hexadecyl group, a n-heptadecyl group, a n-octadecyl group, a n-nonadecyl group, or a n-eicosyl group.

In general formula (1), R1 to R4 each need to be a linear alkyl group having 4 to 20 carbon atoms in terms of enhancing photoelectric conversion characteristics. When an alkyl group having 3 or less carbon atoms is used, the inhibition of the association of the cyanine compound in this embodiment is insufficient, and the adsorption properties of the cyanine compound in this embodiment on a metal oxide semiconductor material tends to deteriorate. On the other hand, when an alkyl group having 21 or more carbon atoms is used, the intermolecular distance is too large, and the efficiency of electron injection from the cyanine compound in this embodiment into a metal oxide semiconductor material tends to decrease. In addition, when only two of R1 to R4 are each a linear alkyl group having 4 to 20 carbon atoms, the inhibition of the association of the cyanine compound in this embodiment is insufficient, and it tends to be difficult to obtain excellent photoelectric conversion characteristics. In addition, when only one or only three of R1 to R4 are each a linear alkyl group having 4 to 20 carbon atoms, the synthesis is difficult, and the cost tends to be higher. In terms of these, it is preferable that in general formula (1), all of R1 to R4 be each a linear alkyl group having 10 to 20 carbon atoms.

In general formula (1), in terms of expanding the π conjugation as the entire molecule to broaden the width of the light absorption wavelength region and setting the maximum absorption wavelength of the light absorption peak around 800 nm, A1 and A2 each need to be any one aromatic ring selected from the above aromatic ring group A. Among these, A1 and A2 are each preferably a benzene ring. A1 and A2 may each be the same aromatic ring or a different aromatic ring, but are each preferably the same aromatic ring in terms of easy synthesis and promoting lower cost.

In general formula (1), the aromatic rings shown in the above aromatic ring group A may each have a substituent. Examples of the substituent that may be introduced into such an aromatic ring include, but are not particularly limited to, a hydroxyl group, a carboxyl group, a nitro group, a cyano group, a halogen atom (F, Cl, Br, and the like), a linear or branched alkyl group having 1 to 4 carbon atoms (a methyl group, an ethyl group, a propyl group, an isopropyl group, a butyl group, a sec-butyl group, a tert-butyl group, and the like), an alkyl halide group having 1 to 4 or less carbon atoms ($CF_3$, $CCl_3$, and the like), an alkoxy group having 1 to 4 carbon atoms (a methoxy group, an ethoxy group, a propyloxy group, an isopropyloxy group, a butyloxy group, a secondary butyloxy group, a tertiary butyloxy group, and the like), and an alkoxy halide group having 1 to 4 carbon atoms. The substituents in the aromatic rings of A1 and A2 may be the same or different.

The cyanine compound in this embodiment may have a counter anion (represented by $An^{p-}$ in general formula (1)) in order to keep the charge of the entire compound neutral. As the counter anion, any can be used as long as it is a monovalent or divalent anion. In $An^{p-}$ in general formula (1), specific examples of the anion in the case of p=1 (monovalent anion; $An^{-}$) include, but are not particularly limited to, a halide ion, such as a fluoride ion ($F^{-}$), a chloride ion ($Cl^{-}$), a bromide ion ($Br^{-}$), or an iodide ion ($I^{-}$), an inorganic anion, such as a hexafluorophosphate ion ($PF_6^{-}$), a hexafluoroantimonate ion ($SbF_6^{-}$), a perchlorate ion ($ClO_4^{-}$), a tetrafluoroborate ion ($BF_4^{-}$), a chlorate ion, or a thiocyanate ion, an organic sulfonate anion, such as a benzenesulfonate ion, a toluenesulfonate ion, a trifluoromethanesulfonate ion, a diphenylamine-4-sulfonate ion, a 2-amino-4-methyl-5-chlorobenzenesulfonate ion, a 2-amino-5-nitrobenzenesulfonate ion, a N-alkyldiphenylamine-4-sulfonate ion, or a N-aryldiphenylamine-4-sulfonate ion, an organic phosphate anion, such as an octyl phosphate ion, a dodecyl phosphate ion, an octadecyl phosphate ion, a phenyl phosphate ion, a nonylphenyl phosphate ion, or a 2,2'-methylenebis(4,6-di-t-butylphenyl) phosphonate ion, and in addition, a bistrifluoromethylsulfonylimide ion, a bisperfluorobutanesulfonylimide ion, a perfluoro-4-ethylcyclohexane sulfonate ion, tetrakis(pentafluorophenyl) borate ion, or a tris(fluoroalkylsulfonyl) carbanion. In addition, in An in general formula (1), examples of the anion in the case of p=2 (divalent anion; $An^{2-}$) include a sulfurate ion ($SO_4^{2-}$), a benzenedisulfonate ion, or a naphthalenedisulfonate ion. Here, q described in general formula (1) is a coefficient for keeping the charge neutral as the entire cyanine compound represented by general formula (1) and may be 0. In addition, in the case of q=1, $An^{p-}$ is $An^-$, which is a monovalent anion, and a salt is formed so as to keep the charge of the entire compound neutral. In addition, when $An^{p-}$ is $An^{2-}$, which is a divalent anion, q=1/2 is satisfied. In other words, q is 0 or 1/p. In addition, the cyanine compound in this embodiment may be the so-called inner salt in which a salt is formed in the molecule. In this case, in the cyanine compound in this embodiment, for example, an acidic group, such as a —$CH_2CH_2COOH$ group, introduced into the nitrogen atom of an indolenine skeleton is ionized.

In the cyanine compound in this embodiment, a linear alkyl group having 4 to 20 carbon atoms is introduced into R1 to R4, and molecular association is inhibited, and therefore, excited electrons are not easily deactivated, and electrons are efficiently injected into a metal oxide semiconductor material. Therefore, it is considered that in a photoelectric conversion element using the cyanine compound in this embodiment as a dye, the proportion of the amount of electrons injected from the cyanine compound in this embodiment into the metal oxide semiconductor material is high with respect to the amount of emitted light, and IPCE (Incident Photons to Current conversion Efficiency) is improved, and as a result, conversion efficiency is improved. IPCE represents the conversion proportion of the number of electrons of photocurrent to the number of photons of emitted light in a photoelectric conversion element and is obtained by IPCE (%)=Isc×1240/λ×1/Φ wherein Isc is short circuit current, λ is wavelength, and Φ is incident light intensity.

In addition, as described above, the cyanine dye described in Patent Document 2 has weak adhesiveness (adsorption properties) to a metal oxide layer, and has insufficient energy conversion efficiency as a dye used in a photoelectric conversion element. From comparison with this cyanine dye described in Patent Document 2, the following is further guessed. In the cyanine compound in this embodiment, a linear alkyl group having 4 to 20 carbon atoms is introduced into R1 to R4, and the association of the cyanine compound is inhibited. On the other hand, a cyclo-ring or the like is not introduced into a heptamethine chain skeleton, and therefore, the cyanine compound in this embodiment has, so to speak, a design in which steric hindrance near an anchor group is relieved, and the adsorption of a —$CH_2CH_2COOH$ group introduced into the nitrogen atom of an indolenine skeleton on a metal oxide layer is promoted, and the adhesiveness is enhanced. In addition, unlike the cyanine dye described in Patent Document 2, a cyclo-ring is not introduced into a heptamethine chain skeleton, and therefore, in the cyanine compound in this embodiment, electron injection into a metal oxide semiconductor material is enhanced. It is considered that as a result of these being combined, a photoelectric conversion element using the cyanine compound in this embodiment has more enhanced energy conversion efficiency than those using the cyanine dye described in Patent Document 2.

As long as the cyanine compound in this embodiment has the cyanine structure represented by general formula (1), other structures are not particularly limited. In addition, as long as the cyanine compound in this embodiment has the cyanine structure represented by general formula (1), even in an enantiomer or diastereoisomer thereof or a mixture thereof, similar effects are obtained. In addition, the above-described "anchor group" refers to a group that has chemical or electrostatic affinity or bonding ability to a metal oxide layer (support) comprising a metal oxide semiconductor material. This anchor group may be introduced into the aromatic rings shown in the above aromatic ring group A, in addition to a —$CH_2CH_2COOH$ group introduced into the nitrogen atom of an indolenine skeleton.

Specific examples of the cyanine compound in this embodiment include, but are not particularly limited to, the following. In the following (B4) to (B18), only structures not including $An^{p-}$ in general formula (1) are shown, but as described above, these may have any $An^{p-}$. In other words, the above-described monovalent or divalent anions can be arbitrarily combined, and so can other anions. In addition, as described above, in the following (B4) to (B18), for example, an acidic group may be ionized to form an inner salt.

[Formula 7]

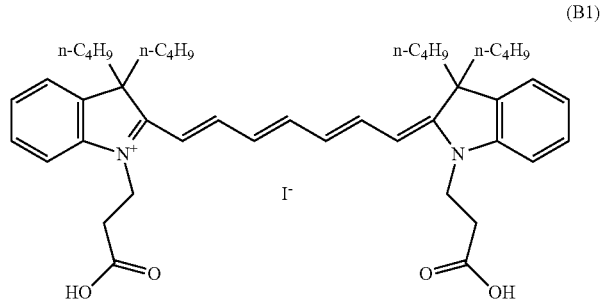

(B1)

[Formula 8]

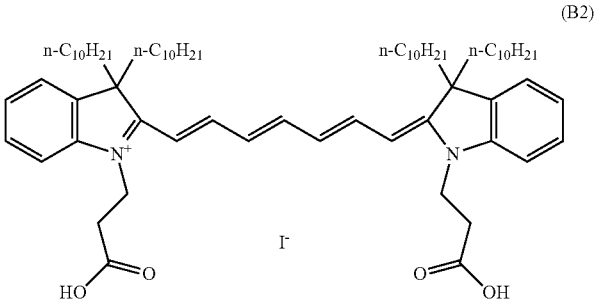

(B2)

-continued
[Formula 9]
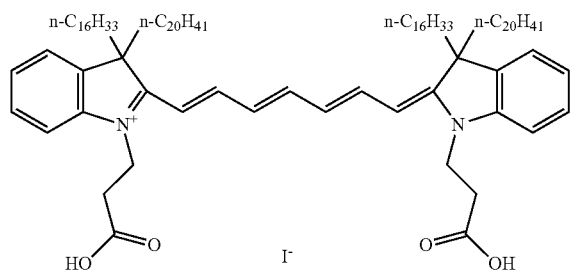
(B3)
[Formula 10]
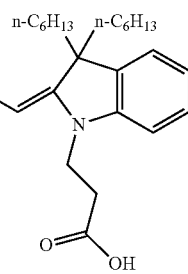
(B4)
[Formula 11]
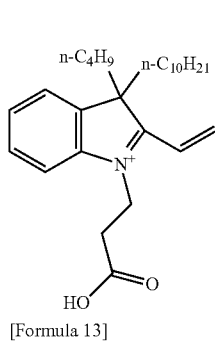
(B5)
[Formula 12]
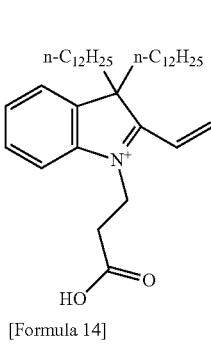
(B6)
[Formula 13]
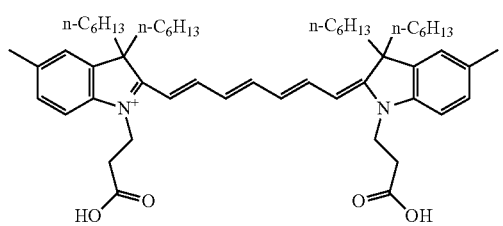
(B7)
[Formula 14]
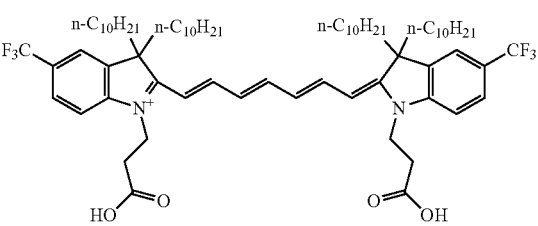
(B8)
[Formula 15]
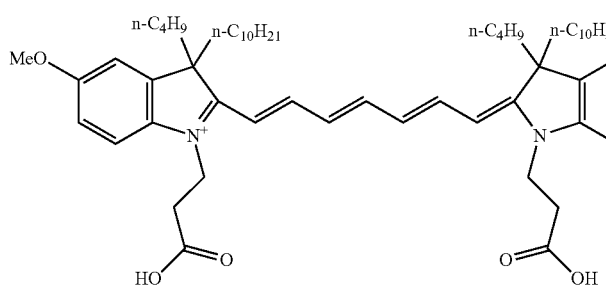
(B9)
[Formula 16]
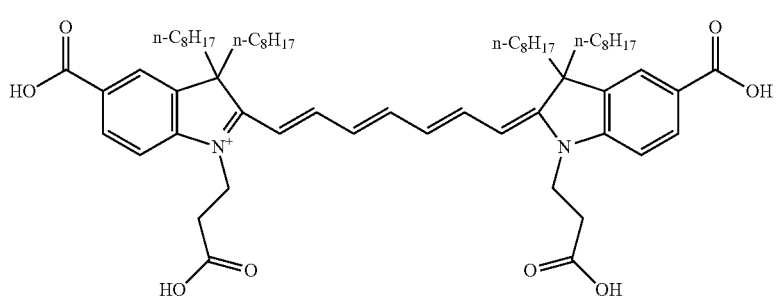
(B10)

-continued

[Formula 17]

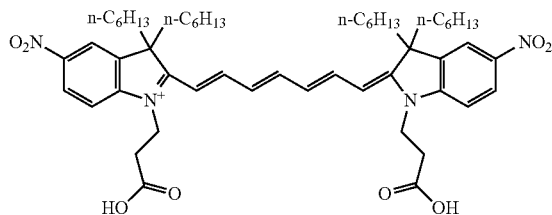
(B11)

[Formula 18]

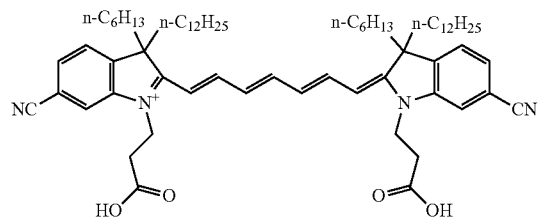
(B12)

[Formula 19]

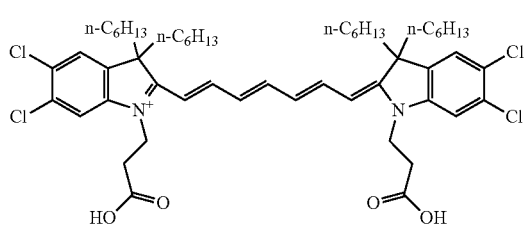
(B13)

[Formula 20]

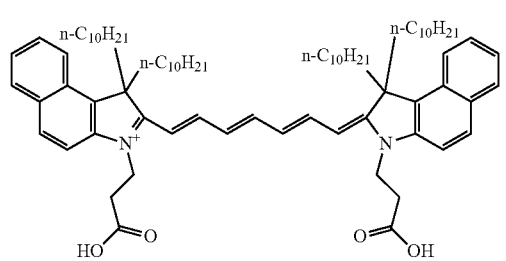
(B14)

[Formula 21]

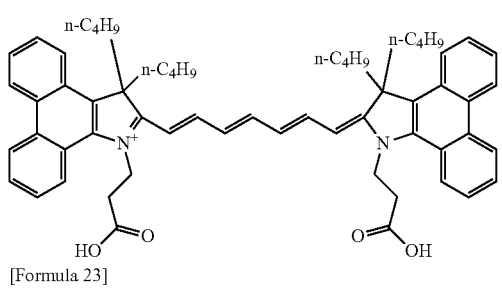
(B15)

[Formula 22]

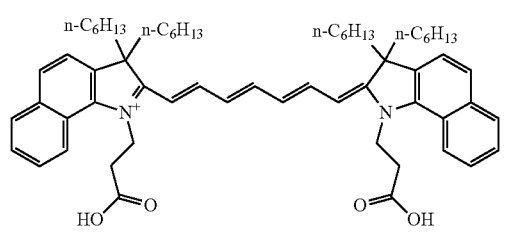
(B16)

[Formula 23]

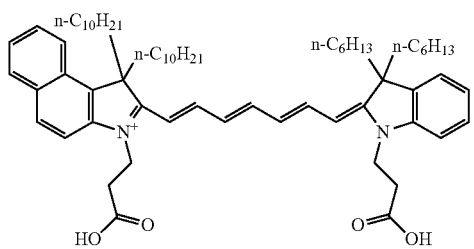
(B17)

[Formula 24]

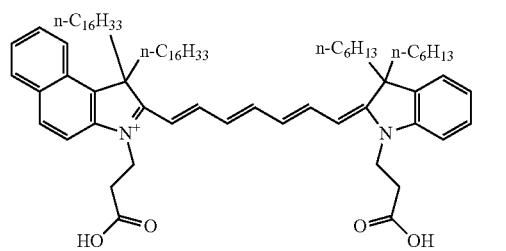
(B18)

In the cyanine compound in this embodiment, the chromaticity coordinates (x, y) in the CIE (Commission Internationale d'Eclairage) Yxy color system is preferably in the range of $0.0 \leq x \leq 0.4$ and $0.3 \leq y \leq 0.8$, more preferably in the range of $0.30 \leq x \leq 0.33$ and $0.32 \leq y \leq 0.35$. The cyanine compound in this embodiment in such a range exhibits a light green color to a green color and can implement a working electrode that is colorless and transparent in visual observation, and therefore, new color variations can be created in a photoelectric conversion element having excellent photoelectric conversion characteristics. In this description, the measurement of chromaticity coordinates (x, y) in the CIE Yxy color system means those measured by fabricating a working electrode for a photoelectric conversion element (one having a metal oxide electrode in which a dye is supported on a substrate) and using this working electrode. At this time, the dye adsorption amount is optimized so that the energy conversion efficiency is the highest.

The cyanine compound represented by general formula (1) can be obtained by a method using a well-known general reaction, and the method for producing it is not particularly limited. For example, as in a route shown in the following chemical reaction formula (I), the cyanine compound represented by general formula (1) can be synthesized from an indolenium salt and amidine hydrochloride.

[Formula 25]

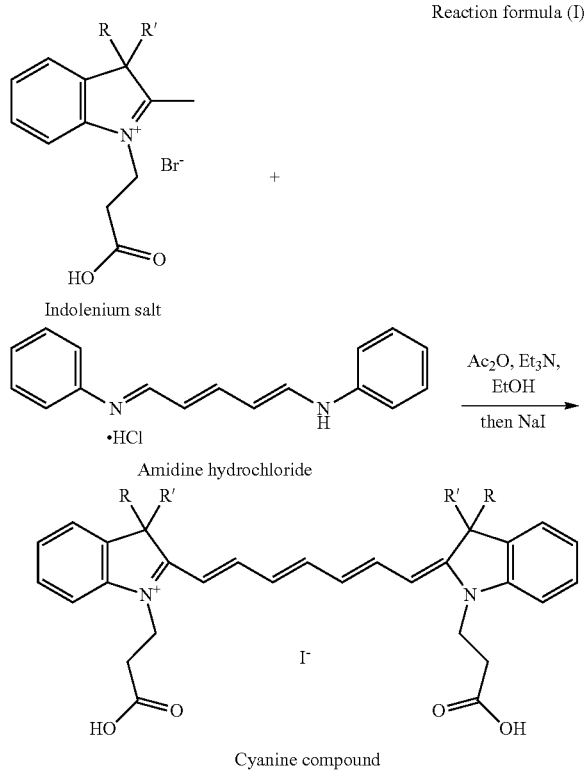

Reaction formula (I)

Next, an example of the use of a dye for a photoelectric conversion element according to this embodiment will be described.

FIG. 1 is a cross-sectional view showing the schematic configuration of a dye-sensitized solar cell 100, which is a photoelectric conversion element in this embodiment.

The dye-sensitized solar cell 100 in this embodiment comprises a working electrode 11, a counter electrode 21, and an electrolyte 31 provided between these working electrode 11 and counter electrode 21. At least one of the working electrode 11 and the counter electrode 21 is an electrode having light transmission properties. The working electrode 11 and the counter electrode 21 are opposed to each other via a spacer 41, and the electrolyte 31 is enclosed in a sealing space defined by these working electrode 11, counter electrode 21, and spacer 41, and a sealing member not shown.

The working electrode 11 functions as a negative electrode with respect to an external circuit. The working electrode 11 comprises a porous metal oxide layer 13 containing a metal oxide (metal oxide semiconductor material) on the conductive surface 12a of a substrate 12, and the compound (dye) having the cyanine structure represented by general formula (1) described above is supported (adsorbed) on the metal oxide layer 13, and thus, a dye-supported metal oxide electrode 14 is formed. In other words, the working electrode 11 in this embodiment has a configuration in which a composite structure in which the compound having the cyanine structure represented by general formula (1) described above is supported (adsorbed) on the metal oxide (metal oxide semiconductor material) surface of the metal oxide layer 13 is laminated on the conductive surface 12a of the substrate 12 (the dye-supported metal oxide electrode 14).

The type, dimensions, and shape of the substrate 12 are not particularly limited as long as it can support at least the metal oxide layer 13, and for example, a plate-shaped or sheet-shaped one can be preferably used. Specific examples thereof include a glass substrate, a plastic substrate, such as polyethylene, polypropylene, polystyrene, tetraacetyl cellulose (TAC), polyethylene terephthalate (PET), polyethylene naphthalate (PEN), syndiotactic polystyrene (SPS), polyphenylene sulfide (PPS), polycarbonate (PC), polyarylate (PAR), polysulfone (PSF), polyester sulfone (PES), polyetherimide (PEI), cyclic polyolefin, or brominated phenoxy, a metal substrate or an alloy substrate, a ceramic substrate, or a laminate thereof. In addition, the substrate 12 preferably has light transmission properties, and one having excellent light transmission properties in the visible light region is more preferable. Further, the substrate 12 preferably has flexibility. In this case, structures in various forms utilizing the flexibility can be provided.

The conductive surface 12a can be provided on the substrate 12, for example, by forming a transparent conductive film on the substrate 12, like a conductive PET film. In addition, by using the substrate 12 having conductivity, the treatment for providing the conductive surface 12a on the substrate 12 can be omitted. Specific examples of the transparent conductive film include, but are not particularly limited to, a metal thin film comprising gold (Au), silver (Ag), platinum (Pt), or the like, and one formed of a conductive polymer or the like, as well as indium-tin oxide (ITO), indium-zinc oxide (IZO), $SnO_2$, and $InO_3$, as well as FTO ($F—SnO_2$) in which $SnO_2$ is doped with fluorine. Each of these may be used alone, or a plurality of these may be used in combination. The method for forming the transparent conductive film is not particularly limited, and a publicly known method, for example, vapor deposition, CVD, spraying, spin coating, or immersion, can be applied. In addition, the film thickness of the transparent conductive film can be appropriately set. The conductive surface 12a of the substrate 12 may be subjected to appropriate surface modification treatment as required. Specific examples thereof include, but are not particularly limited to, publicly known surface treatment, such as degreasing treatment with a surfactant, an organic solvent, an alkaline aqueous solution, or the like, mechanical polishing treatment, immersion treatment in an aqueous solution, preliminary electrolysis treatment with an electrolytic solution, water washing treatment, and drying treatment.

The metal oxide layer 13 is a support for supporting the dye. For the metal oxide layer 13, generally, one having a porous structure having many voids and a large surface area is used, and the metal oxide layer 13 is preferably one that is fine and has a few voids, and is more preferably film-shaped. Particularly, the metal oxide layer 13 is more preferably a structure in which porous fine particles adhere.

The metal oxide layer 13 in this embodiment is a porous semiconductor layer comprising a metal oxide, such as titanium oxide, zinc oxide, tin oxide, niobium oxide, indium oxide, zirconium oxide, tantalum oxide, vanadium oxide, yttrium oxide, aluminum oxide, or magnesium oxide, as the main component. Only one of these metal oxides may be used alone, or two or more of these metal oxides may be combined (mixed, a mixed crystal, a solid solution, or the like) and used. For example, a combination of zinc oxide and tin oxide, titanium oxide and niobium oxide, or the like can be used. In terms of obtaining high energy conversion efficiency, the metal oxide layer 13 is preferably a layer substantially composed of zinc oxide. Here, "substantially composed of zinc oxide" means comprising 95 wt % or more of zinc oxide. The metal oxide layer 13 may comprise metals, such as titanium, tin, zinc, iron, tungsten, zirconium, strontium, indium, cerium, vanadium, niobium, tantalum, cadmium, lead, antimony, and bismuth, and metal oxides thereof and metal chalcogenides thereof. The thickness of the metal oxide layer 13 is not particularly limited, but is preferably 0.05 to 50 µm.

Examples of a method for forming the metal oxide layer 13 include, but are not particularly limited to, a method of providing a dispersion of a metal oxide on the conductive surface 12a of the substrate 12 and then drying it, a method of providing a dispersion or paste of a metal oxide (metal oxide slurry) on the conductive surface 12a of the substrate 12 and then high-temperature sintering it, and a method of providing a dispersion or paste of a metal oxide on the conductive surface 12a of the substrate 12 and then performing low-temperature treatment at about 50 to 150° C., as well as a method of performing cathode electrodeposition on the conductive surface 12a of the substrate 12 from an electrolytic solution containing a metal salt. Here, when a method that does not require high-temperature sintering is used, a plastic material having low heat resistance can be used as the substrate 12, and therefore, the working electrode 11 having high flexibility can be fabricated.

As a dye (sensitizing dye) that can inject electrons into a metal oxide by absorbing light and being excited, the compound having the cyanine structure represented by general formula (1) described above is supported (adsorbed) on the metal oxide layer 13.

The dye may include, in addition to the compound having the cyanine structure represented by general formula (1) described above, other dyes (sensitizing dyes). One having the desired light absorption band and absorption spectrum can be applied according to the performance required of the photoelectric conversion element.

Specific examples of the other dyes include an organic dye, such as eosine Y, dibromofluorescein, fluorescein, rhodamine B, pyrogallol, dichlorofluorescein, Erythrosine B (Erythrosine is a registered trademark), fluorescin, Mercurochrome, a cyanine dye, a merocyanine disazo dye, a trisazo dye, an anthraquinone dye, a polycyclic quinone dye, an indigo dye, a diphenylmethane dye, a trimethylmethane dye, a quinoline dye, a benzophenone dye, a naphthoquinone dye, a perylene dye, a fluorenone dye, a squarylium dye, an azulenium dye, a perinone dye, a quinacridone dye, a metal-free phthalocyanine dye, or a metal-free porphyrin dye. In addition, these other dyes preferably have an anchor group (for example, a carboxyl group, a sulfonic acid group, or a phosphoric acid group) that can be bonded or adsorbed on a metal oxide. Each of these other dyes may be used alone, or a plurality of these other dyes may be used in combination.

In addition, as the other dyes, for example, organometallic complex compounds can also be used. Specific examples of the organometallic complex compounds include an organo-metallic complex compound having both an ionic coordinate bond formed by a nitrogen anion in an aromatic heterocycle and a metal cation, and a nonionic coordinate bond formed between a nitrogen atom or a chalcogen atom and a metal cation, and an organometallic complex compound having both an ionic coordinate bond formed by an oxygen anion or a sulfur anion and a metal cation, and a nonionic coordinate bond formed between a nitrogen atom or a chalcogen atom and a metal cation. More specific examples include a metal phthalocyanine dye, such as copper phthalocyanine or titanyl phthalocyanine, a metal naphthalocyanine dye, a metal porphyrin dye, and a ruthenium complex, such as a bipyridyl ruthenium complex, a terpyridyl ruthenium complex, a phenanthroline ruthenium complex, a bicinchoninic acid ruthenium complex, an azo ruthenium complex, or a quinolinol ruthenium complex. Each of these may be used alone, or a plurality of these may be used in combination.

In addition, the dye may comprise one or two or more additives. Examples of the additives include an association inhibitor for inhibiting the association of the dye, specifically, a cholic acid compound represented by chemical formula (2). These may be used alone, or a plurality of these may be mixed and used.

[Formula 26]

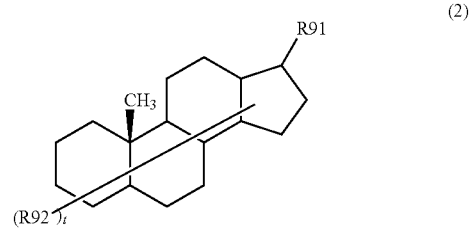

(2)

wherein R91 is an alkyl group having an acidic group; R92 represents a group bonded to any of carbon atoms constituting a steroid skeleton in the chemical formula, is a hydroxyl group, a halogen group, an alkyl group, an alkoxy group, an aryl group, a heterocyclic group, an acyl group, an acyloxy group, an oxycarbonyl group, an oxo group, or an acidic group, or a derivative thereof, and may be the same or different; t is an integer of 1 or more and 5 or less; and the bond between the carbon atoms constituting the steroid skeleton in the chemical formula may be a single bond or a double bond.

The method for supporting the dye on the metal oxide layer 13 is not particularly limited. Specific examples of the method include a method of immersing the metal oxide layer 13 in a solution comprising the dye, and a method of applying a solution comprising the dye to the metal oxide layer 13. The solvent of the dye-containing solution used here can be appropriately selected from publicly known solvents, for example, water, an ethanol solvent, a nitrile solvent, and a ketone solvent, according to the solubility, compatibility, or the like of the dye used.

Here, when the metal oxide layer 13 is formed by cathode electrodeposition, it is also possible to simultaneously perform the formation of the metal oxide layer 13 and dye support by using an electrolytic solution comprising a metal salt and a dye, to immediately form the dye-supported metal oxide electrode 14 in which the dye is supported (adsorbed) on the metal oxide surface of the metal oxide layer 13. The electrolysis conditions should be appropriately set according to the ordinary method according to the characteristics of the materials used. For example, when the dye-supported metal oxide electrode 14 composed of ZnO and a dye is formed, it is preferable that the reduction electrolysis potential be about −0.8 to −1.2 V (vs. Ag/AgCl), the pH be about 4 to 9, and the bath temperature of the electrolytic solution be about 0 to 100° C. In addition, it is preferable that the metal ion concentration in the electrolytic solution be about 0.5 to 100 mM, and the dye concentration in the electrolytic solution be about 50 to 500 µM. Further, in order to further enhance photoelectric conversion characteristics, it is possible to desorb the dye from the metal oxide layer 13 on which the dye is supported, once, and then readsorb another dye.

The working electrode 11 (metal oxide electrode 14) may have an intermediate layer between the conductive surface 12a of the substrate 12 and the metal oxide layer 13. The material of the intermediate layer is not particularly limited, but for example, the metal oxides described for the above transparent conductive film 12a are preferable. The intermediate layer can be formed by precipitating or depositing a metal oxide on the conductive surface 12a of the substrate 12 by a publicly known method, for example, vapor deposition, CVD, spraying, spin coating, immersion, or electrodeposition. The intermediate layer preferably has light transmission properties and further preferably has conductivity. In addition, the thickness of the intermediate layer is not particularly limited, but is preferably about 0.1 to 5 µm.

The counter electrode 21 functions as a positive electrode with respect to the external circuit. The counter electrode 21 is composed of a substrate 22 having a conductive surface 22a, and is opposed so that the conductive surface 21a faces the metal oxide layer 13 of the working electrode 11. For the substrate 22 and the conductive surface 22a, those publicly known can be appropriately used, as in the substrate 12 and the conductive surface 12a described above. For example, in addition to the substrate 12 having conductivity, one having the transparent conductive film 12a on the substrate 12, and one in which a film (plate or foil) of a metal, such as platinum, gold, silver, copper, aluminum, indium, molybdenum, titanium, rhodium, ruthenium, or magnesium, carbon, a conductive polymer, or the like is further formed on the transparent conductive film 12a of the substrate 12 can be used.

As the electrolyte 31, one generally used in a cell, a solar cell, or the like, such as a redox electrolyte having a redox pair, a semisolid electrolyte obtained by gelling this, or one obtained by forming a p-type semiconductor solid hole transport material into a film, can be appropriately used. For the electrolyte 31, one may be used alone, or two or more may be used in combination.

Examples of the redox electrolyte include an $I^-/I_3^-$ system, a $Br^-/Br_3^-$ system, or a quinone/hydroquinone system, specifically, a combination of a halide salt and a halogen simple substance, such as a combination of an iodide salt and an iodine simple substance, or a combination of a bromide salt and a bromine. The content of such a redox agent is not particularly limited, but is preferably $1 \times 10^{-4}$ to $1 \times 10^{-2}$ mol/g, more preferably $1 \times 10^{-3}$ to $1 \times 10^{-2}$ mol/g, with respect to the total amount of the electrolyte.

Examples of the above halide salt include cesium halides, quaternary alkylammonium halides, imidazolium halides, thiazolium halides, oxazolium halides, quinolinium halides, or pyridinium halides. More specifically, examples of iodide salts thereof include cesium iodide, quaternary alkylammonium iodides, such as tetraethylammonium iodide, tetrapropylammonium iodide, tetrabutylammonium iodide, tetrapentylammonium iodide, tetrahexylammonium iodide, tetraheptylammonium iodide, or trimethylphenylammonium iodide, imidazolium iodides, such as 3-methylimidazolium iodide or 1-propyl-2,3-dimethylimidazolium iodide, thiazo-lium iodides, such as 3-ethyl-2-methyl-2-thiazolium iodide, 3-ethyl-5-(2-hydroxyethyl)-4-methylthiazolium iodide, or 3-ethyl-2-methylbenzothiazolium iodide, oxazolium iodides, such as 3-ethyl-2-methyl-benzoxazolium iodide, quinolinium iodides, such as 1-ethyl-2-methylquinolinium iodide, or pyridinium iodides. In addition, examples of bromide salts include quaternary alkylammonium bromides. Among combinations of a halide salt and a halogen simple substance, a combination of at least one of the above-described iodide salts and an iodine simple substance is preferable.

In addition, the redox electrolyte may be, for example, a combination of an ionic liquid and a halogen simple substance. In this case, the above-described halide salts or the like may be further contained. For the ionic liquid, one generally used in a cell, a solar cell, or the like can be appropriately used, and the ionic liquid is not particularly limited. Specific examples of the ionic liquid include those disclosed in "Inorg. Chem." 1996, 35, p 1168 to 1178, "Electrochemistry" 2002, 2, p 130 to 136, National Publication of International Patent Application No. 9-507334, or Japanese Patent Laid-Open No. 8-259543.

The ionic liquid is preferably a salt having a melting point lower than room temperature (25° C.), or a salt that is liquefied at room temperature by dissolution with another molten salt or the like even if it has a melting point higher than room temperature. Specific examples of such an ionic liquid include anions and cations shown below.

Examples of ionic liquid cations include ammonium, imidazolium, oxazolium, thiazolium, oxadiazolium, triazolium, pyrrolidinium, pyridinium, piperidinium, pyrazolium, pyrimidinium, pyrazinium, triazinium, phosphonium, sulfonium, carbazolium, indolium, and derivatives thereof Each of these may be used alone, or a plurality of these may be used in combination. Specific examples include 1-methyl-3-propylimidazolium, 1-butyl-3-methylimidazolium, 1,2-dimethyl-3-propylimidazolium, or 1-ethyl-3-methylimidazolium.

Examples of ionic liquid anions include a metal chloride, such as $AlCl_4^-$ or $Al_2Cl_7^-$, a fluorine-containing compound ion, such as $PF_6^-$, $BF_4^-$, $CF_3SO_3^-$, $N(CF_3SO_2)_2^-$, $F(HF)_n^-$, or $CF_3COO^-$, a non-fluorine compound ion, such as $NO_3^-$, $CH_3COO^-$, $C_6H_{11}COO^-$, $CH_3OSO_3^-$, $CH_3OSO_2^-$, $CH_3SO_3^-$, $CH_3SO_2^-$, $(CH_3O)_2PO_2^-$, $N(CN)_2^-$, or $SCN^-$, or a halide ion, such as an iodide ion or a bromide ion. Each of these may be used alone, or a plurality of these may be used in combination. Among these, an iodide ion is preferable as the ionic liquid anion.

The electrolyte 31 may be a liquid electrolyte (electrolytic solution) in which the above-described redox electrolyte is dissolved, dispersed, or suspended in a solvent, or a solid polymer electrolyte in which the above-described redox electrolyte is held in a polymer substance. In addition, the electrolyte 31 may be a quasi-solid (paste) electrolyte comprising a redox electrolyte and a particulate conductive carbon material, such as carbon black. Here, in this description, a "quasi-solid" means a concept including, in addition to a solid, a gel solid or a clay-like solid whose flowability is hardly seen but which can be deformed by the application of stress, and specifically means one in which no or slight shape change occurs due to self-weight after it is allowed to stand still and left for a certain time. The quasi-solid electrolyte comprising a conductive carbon material need not comprise a halogen simple substance because the conductive carbon material has the function of catalyzing a redox reaction.

The electrolyte 31 may comprise an organic solvent in which the above-described halide salt or ionic liquid or the like is to be dissolved, dispersed, swelled, or suspended. The organic solvent can be used without particular limitation as long as it is electrochemically inert, but an organic solvent having a melting point of 20° C. or less and a boiling point of 80° C. or more is preferable. By using an organic solvent having a melting point and a boiling point in this range, the durability tends to be enhanced. In addition, an organic solvent having high viscosity is preferable. Since high viscosity provides a high boiling point, electrolyte leakage tends to be inhibited even under a high-temperature environment. Further, an organic solvent having high electrical conductivity is preferable. Because of high electrical conductivity, high energy conversion efficiency tends to be obtained.

Specific examples of the organic solvent include hexane, benzene, toluene, quinoline, diethyl ether, chloroform, ethyl acetate, tetrahydrofuran, methylene chloride, acetone, acetonitrile, methoxyacetonitrile, propionitrile, butyronitrile, benzonitrile, 3-methoxypropionitrile, valeronitrile, N,N-dimethylformamide, dimethyl sulfoxide, sulfolane, acetic acid, formic acid, methanol, ethanol, 1-propanol, 2-propanol, 1-butanol, pentanol, methyl ethyl ketone, dimethyl carbonate, ethyl methyl carbonate, ethylene carbonate, propylene carbonate, ethylene glycol monoalkyl ether, propylene glycol monoalkyl ether, polyethylene glycol monoalkyl ether, polypropylene glycol monoalkyl ether, ethylene glycol, propylene glycol, polyethylene glycol, polypropylene glycol, glycerin, dioxane, 1,4-dioxane, ethylene glycol dialkyl ether, propylene glycol dialkyl ether, polyethylene glycol dialkyl ether, polypropylene glycol dialkyl ether, N-methylpyrrolidone, γ-butyrolactone, α-methyl-γ-butyrolactone, β-methyl-γ-butyrolactone, γ-valerolactone, and 3-methyl-γ-valerolactone. Among these, an organic solvent having at least one of a nitrile group, a carbonate ester structure, a cyclic ester structure, a lactam structure, an amide group, an alcohol group, a sulfinyl group, a pyridine ring, and a cyclic ether structure, as a functional group, is preferable because with an organic solvent having such a functional group, higher effects are obtained than with an organic solvent comprising none of these functional groups. Examples of the organic solvent having such a functional group include acetonitrile, propylnitrile, butyronitrile, methoxyacetonitrile, methoxypropionitrile, dimethyl carbonate, ethyl methyl carbonate, ethylene carbonate, propylene carbonate, N-methylpyrrolidone, pentanol, quinoline, N,N-dimethylformamide, γ-butyrolactone, dimethyl sulfoxide, or 1,4-dioxane, particularly, methoxypropionitrile, propylene carbonate, N-methylpyrrolidone, pentanol, quinoline, N,N-dimethylformamide, γ-butyrolactone, dimethyl sulfoxide, 1,4-dioxane, methoxyacetonitrile, and butyronitrile. Each of these organic solvents may be used alone, or a plurality of these organic solvents may be used in combination. In addition, the content of the organic solvent is preferably 10 to 80 wt % with respect to the total amount of the electrolyte 31.

The electrolyte 31 may comprise various additives according to the required performance. For the additives, those generally used in a cell, a solar cell, or the like can be appropriately used. Specific examples thereof include, but are not particularly limited to, a p-type conductive polymer, such as polyaniline, polyacetylene, polypyrrole, polythiophene, polyphenylene, polyphenylenevinylene, and derivatives thereof; a molten salt composed of a combination of an imidazolium ion, a pyridinium ion, a triazolium ion, and derivatives thereof with a halogen ion; a gelling agent; an oil gelling agent; a dispersing agent; a surfactant; and a stabilizer.

The method for disposing the electrolyte 31 between the working electrode 11 and the counter electrode 21 is not particularly limited, and various publicly known methods can be used. For example, the dye-supported metal oxide electrode 14, which is the working electrode 11, and the conductive surface 22a of the counter electrode 21 are opposed to each other at a predetermined interval via a spacer as required, and the peripheries are bonded to each other except a previously formed injection port, using a sealing agent or the like, and then, the whole is sealed. Then, the electrolyte is injected between the working electrode 11 and the counter electrode 21 from the injection port, and then, the injection port is sealed, and thus, the electrolyte 31 can be formed.

When a solid charge transfer material is used as the electrolyte 31, an electron transport material, a hole transport material, or the like is preferably used.

As the hole transport material, for example, aromatic amines and triphenylene derivatives are preferably used. Specific examples thereof include, but are not particularly limited to, an organic conductive polymer, such as an oligothiophene compound, polypyrrole, polyacetylene or a derivative thereof, poly(p-phenylene) or a derivative thereof, poly(p-phenylenevinylene) or a derivative thereof, polythienylenevinylene or a derivative thereof, polythiophene or a derivative thereof, polyaniline or a derivative thereof, or polytoluidine or a derivative thereof.

In addition, as the hole transport material, for example, a p-type inorganic compound semiconductor can also be used. In this case, a p-type inorganic compound semiconductor having a band gap of 2 eV or more is preferably used, and a p-type inorganic compound semiconductor having a band gap of 2.5 eV or more is more preferable. In addition, it is necessary that the ionization potential of the p-type inorganic compound semiconductor is smaller than the ionization potential of the working electrode 11 from the conditions under which the holes of the dye can be reduced. Although the preferable range of the ionization potential of the p-type inorganic compound semiconductor is different depending on the dye used, the ionization potential is preferably in the range of 4.5 eV or more and 5.5 eV or less, more preferably in the range of 4.7 eV or more and 5.3 eV or less.

As the p-type inorganic compound semiconductor, for example, a compound semiconductor comprising monovalent copper is preferably used. Specific examples of the compound semiconductor comprising monovalent copper include, but are not particularly limited to, CuI, CuSCN, CuInSe$_2$, Cu(In, Ga)Se$_2$, CuGaSe$_2$, Cu$_2$O, CuS, CuGaS$_2$, CuInS$_2$, CuAlSe$_2$, GaP, NiO, CoO, FeO, Bi$_2$O$_3$, MoO$_2$, and Cr$_2$O$_3$.

The method for forming the electrolyte 31 from the solid charge transfer material is not particularly limited, and various publicly known methods can be used. When a hole transport material comprising an organic conductive polymer is used, a method, for example, vacuum deposition, casting, application, spin coating, immersion, electrolytic polymerization, or photoelectrolytic polymerization, can be used. In addition, when an inorganic solid compound is used, a method, for example, casting, application, spin coating, immersion, or electrolytic plating, can be used.

In the dye-sensitized solar cell 100 in this embodiment, when light (sunlight, or ultraviolet light, visible light, or near infrared light equivalent to sunlight) is emitted to the working electrode 11, the dye absorbs the light, is excited, and injects electrons into the metal oxide layer 13. The injected electrons are transferred to the adjacent conductive surface 12a, and then reach the counter electrode 21 via the external circuit. On the other hand, the electrolyte 31 is oxidized so as to return (reduce) the dye, which is oxidized with the electron transfer, to the ground state. This oxidized electrolyte 31 is reduced by receiving the above electrons. In this manner, the electron transfer between the working electrode 11 and the counter electrode 21 and the accompanying redox reaction of the electrolyte 31 are repeated, and thus, continuous electron transfer occurs, and photoelectric conversion is steadily performed.

Here, in the dye-sensitized solar cell 100 in this embodiment, the compound having the cyanine structure represented by general formula (1) described above is used, and therefore, the proportion of the amount of electrons injected from the dye into the metal oxide layer 13 to the amount of emitted light is higher than that in conventional ones, particularly in the near infrared region. Therefore, energy conversion efficiency can be improved. Particularly, in the dye-sensitized solar cell 100 using the working electrode 11 in which the metal oxide layer 13 is substantially composed of zinc oxide, energy conversion efficiency is further enhanced.

EXAMPLES

The present invention will be described below in detail by giving Synthesis Examples, Examples, and Comparative Examples, but the present invention is not limited to these.

First, as the compound having the cyanine structure represented by general formula (1), cyanine compounds (iodides) having structures represented by chemical formulas (B1) to (B3) were synthesized.

Synthesis Example 1

As shown in the following chemical reaction formula (I-1), 0.46 mmol of indolenium salt I, 0.22 mmol of amidine hydrochloride, 4.4 mmol of acetic anhydride, 0.51 mmol of triethylamine, and 3 g of acetonitrile were fed, and stirred at 85° C. for 3 hours, and then, sodium iodide was added. The reaction product obtained in this manner was subjected to silica gel purification using an eluate with chloroform:methanol being 10:1, and then dried under reduced pressure to obtain 8 mg (yield 4%) of the cyanine compound having the structure represented by chemical formula (B 1), which was the final product.

[Formula 27]

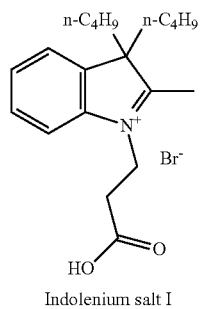

Indolenium salt I

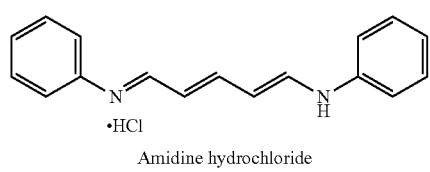

Amidine hydrochloride

Reaction formula (1-1)

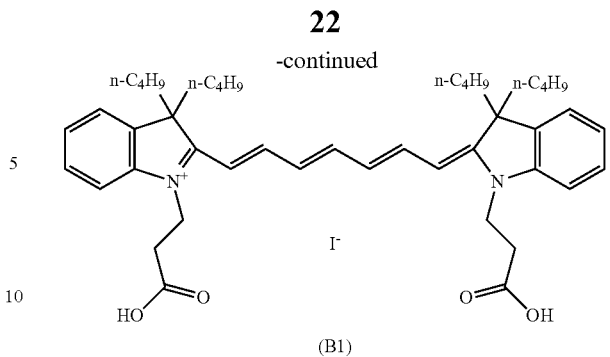

(B1)

Synthesis Example 2

As shown in the following chemical reaction formula (I-2), 2 mmol of indolenium salt II, 1 mmol of amidine hydrochloride, 2.4 mmol of acetic anhydride, 4 mmol of triethylamine, and 4 g of acetonitrile were fed, and stirred at room temperature for 3 hours, and then, sodium iodide was added. The reaction product obtained in this manner was subjected to silica gel purification using an eluate with chloroform:methanol being 10:1, and then dried under reduced pressure to obtain 310 mg (yield 27%) of the cyanine compound having the structure represented by chemical formula (B2), which was the final product.

[Formula 28]

Reaction formula (1-2)

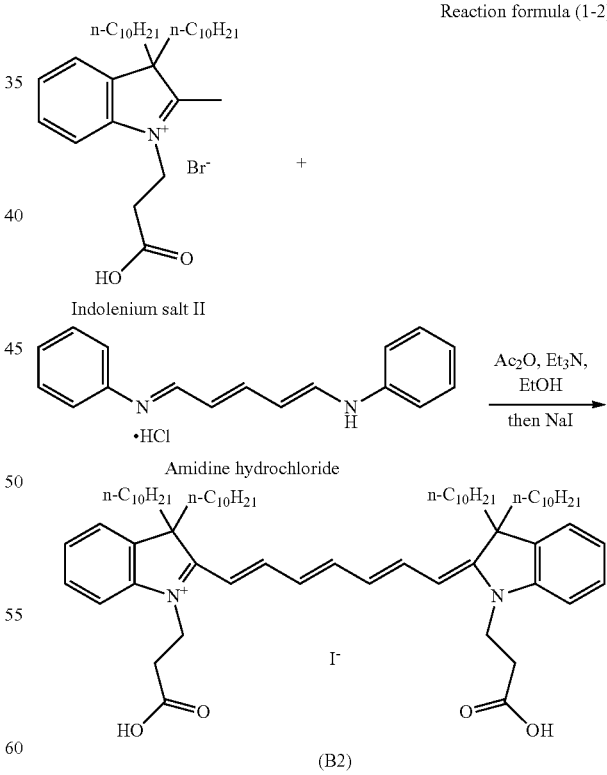

(B2)

Synthesis Example 3

As shown in the following chemical reaction formula (I-3), 0.5 mmol of indolenium salt III, 0.25 mmol of amidine hydrochloride, 0.5 mmol of acetic anhydride, 0.5 mmol of triethylamine, and 1.2 g of acetonitrile were fed, and stirred at room temperature for 5 hours, and then, sodium iodide was added. The reaction product obtained in this manner was subjected to silica gel purification using an eluate with chloroform:methanol being 10:1, and then dried under reduced pressure to obtain 8 mg (yield 2%) of the cyanine compound having the structure represented by chemical formula (B3), which was the final product.

[Formula 29]

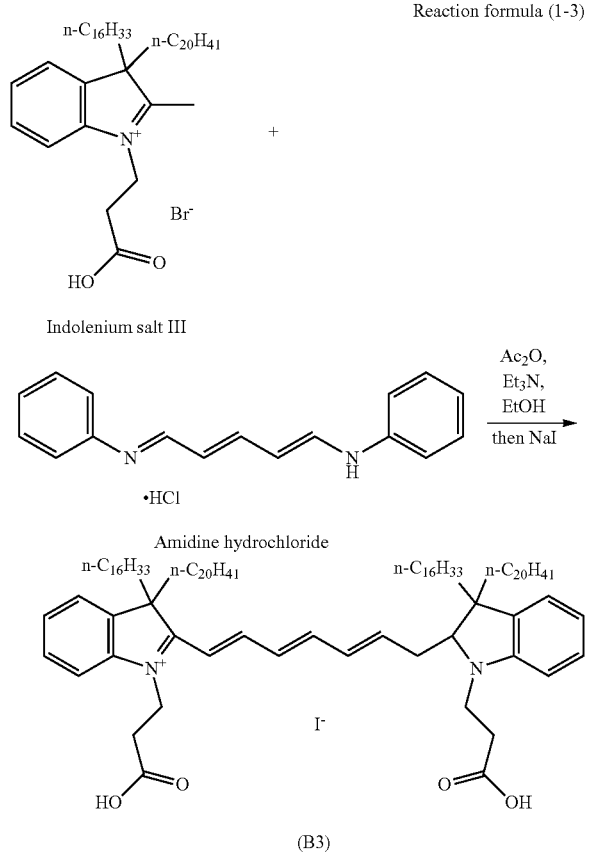

For the final products of these Synthesis Examples 1 to 3, the structure was identified by nuclear magnetic resonance (NMR), and the maximum absorption wavelength (max) was measured. The measurement results are shown in Table 1 and Table 2.

In NMR measurement, Lambda-400 manufactured by JOEL was used as the measurement apparatus. At this time, in Synthesis Examples 1 and 3, a solution in which 3 to 10 mg of the final product was dissolved in 1 cm³ of deuterated chloroform ($CDCl_3$), a deuterated solvent, was used as the measurement sample, and a ¹H-NMR spectrum was measured at room temperature. In addition, in Synthesis Example 2, measurement was performed as in Synthesis Examples 1 and 3 except that $CD_3OD$ was used instead of $CDCl_3$, a deuterated solvent.

In addition, when the maximum absorption wavelength (λmax) was examined, a UV spectrum meter (U-3010) manufactured by Hitachi, Ltd. was used. In this case, the final product was prepared in methanol ($CH_3OH$; solvent) so that the absorbance was in the range of 0.5 to 1.0, and was used for measurement.

TABLE 1

| Cyanine | ¹H NMR |
|---|---|
| Synthesis Example 1 ($CDCl_3$) | 7.86 (t, 2H), 7.70 (s, 1H), 7.48 (d, 2H), 7.34-7.32 (m, 4H), 7.22 (t, 2H), 6.47 (t, 4H), 4.26 (s, 4H), 2.46 (s, 4H), 2.14 (t, 8H), 1.06 (m, 4H), 0.76 (d, 4H), 0.71-0.61 (m, 16H), 0.39 (d, 4H) |
| Synthesis Example 2 ($CD_3OD$) | 7.94 (t, 2H), 7.59 (t, 1H), 7.44-7.24 (m, 8H), 6.61 (t, 2H), 6.47 (d, 2H), 4.34 (t, 4H), 2.65 (t, 4H), 2.32-2.11 (m, 8H), 1.28-1.14 (m, 60H), 0.87 (t, 12H), 0.55 (t, 4H) |
| Synthesis Example 3 ($CDCl_3$) | 7.66-7.21 (m, 15H), 4.35 (t, 4H), 2.01 (t, 4H), 1.57-0.78 (m, 148H) |

TABLE 2

| Cyanine | Yield/% | λ max in MeOH/nm |
|---|---|---|
| Synthesis Example 1 | 4 | 753 |
| Synthesis Example 2 | 27 | 754 |
| Synthesis Example 3 | 3 | 754 |

As shown in Table 1 and Table 2, it was confirmed that in Synthesis Examples 1 to 3, the cyanine compounds (iodides) having the structures represented by chemical formulas (B1) to (B3) were each synthesized.

Next, the dye-sensitized solar cell 100 described in the above embodiment was fabricated by the following procedure.

Example 1

Using the cyanine compound having the structure represented by chemical formula (B1) in Synthesis Example 1 described above, as a dye, the dye-sensitized solar cell 100 described in the above embodiment was fabricated by the following procedure.

First, the working electrode 11 was fabricated by the following procedure. First, as the substrate 12 having the conductive surface 12a, a 2.0 cm long by 1.5 cm wide by 1.1 mm thick conductive glass substrate (F—$SnO_2$) comprising fluorine-doped SnO as a transparent conductive film was prepared. Then, a 70 μm thick masking tape was affixed to the conductive surface 12a so as to surround a 0.5 cm long by 0.5 cm wide quadrangle, and a 3 cm³ of a metal oxide slurry was applied to this portion with uniform thickness and dried. In this case, as the metal oxide slurry, one prepared by suspending 10% by weight of a zinc oxide powder (average particle diameter 20 nm; FINEX-50 manufactured by Sakai Chemical Industry Co., Ltd.) in water to which one drop of Triton X-100 (Triton is a registered trademark) as a nonionic surfactant was added was used. Then, the masking tape on the conductive surface 12a was peeled off, and this substrate 12 was fired at 450° C. by an electric furnace to form a zinc oxide film having a thickness of about 5 μm as the metal oxide layer 13. Then, the cyanine compound having the structure represented by chemical formula (B1) and deoxycholic acid were dissolved in absolute ethanol at concentrations of $3 \times 10^{-4}$ mol/dm³ and $1 \times 10^{-2}$ mol/dm³ respectively to prepare a dye-containing solution. Then, the substrate 12 on which the metal oxide layer 13 was formed was immersed in this dye-containing solution to support the cyanine compound having the structure represented by chemical formula (B1) on the metal oxide layer 13 to form the dye-supported metal oxide electrode 14, thereby obtaining the working electrode 11 of Example 1.

Next, the counter electrode 21 was fabricated by the following procedure.

First, as the substrate 22 having the conductive surface 22*a*, a 2.0 cm long by 1.5 cm wide by 1.1 mm thick conductive glass substrate (F—SnO$_2$) comprising fluorine-doped SnO as a transparent conductive film was prepared. Then, a 100 nm thick Pt layer was formed on the conductive surface 22*a* by sputtering to obtain the counter electrode 21. In this case, two electrolytic solution injection holes (Φ1 mm) were previously made in the substrate 22 having the conductive surface 22*a*.

Then, dimethylhexylimidazolium iodide (0.6 mol/dm$^3$), lithium iodide (0.1 mol/dm$^3$), and iodine (0.05 mol/dm$^3$) were mixed with acetonitrile at respective predetermined concentrations to prepare an electrolytic solution.

Then, using the working electrode 11 and the counter electrode 21 and the electrolytic solution described above, the dye-sensitized solar cell 100 was fabricated by the following procedure.

First, a 50 μm thick spacer was disposed so as to surround the metal oxide layer 13, and then, the dye-supported metal oxide electrode 14, which was the working electrode 11, and the Pt layer of the counter electrode 21 were opposed to each other, and bonded to each other via the spacer. Then, the electrolytic solution was injected from the injection holes made in the counter electrode 21 to form the electrolyte 31. Finally, the entire periphery of the cell, and the injection holes were sealed to obtain the dye-sensitized solar cell 100 of Example 1.

Example 2

Processing was performed as in Example 1 except that as the dye, the cyanine compound having the structure represented by chemical formula (B2) in Synthesis Example 2 was used instead of the cyanine compound having the structure represented by chemical formula (B1) in Synthesis Example 1, to obtain the working electrode 11 and the dye-sensitized solar cell 100 of Example 2.

Example 3

Processing was performed as in Example 1 except that as the dye, the cyanine compound having the structure represented by chemical formula (B3) in Synthesis Example 3 was used instead of the cyanine compound having the structure represented by chemical formula (B1) in Synthesis Example 1, to obtain the working electrode 11 and the dye-sensitized solar cell 100 of Example 3.

Comparative Examples 1 to 4

Processing was performed as in Example 1 except that as the dye, the following dyes (C1) to (C4) were respectively used instead of the cyanine compound having the structure represented by chemical formula (B1) in Synthesis Example 1, to obtain the working electrodes 11 and the dye-sensitized solar cells 100 of Comparative Examples 1 to 4.

[Formula 30]

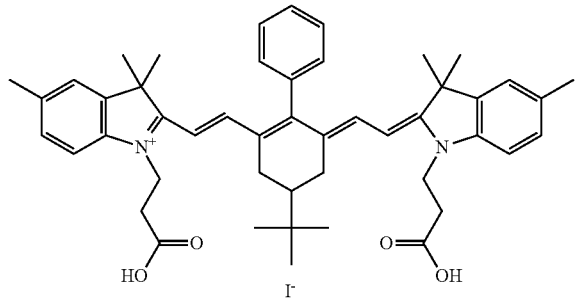

(C1)

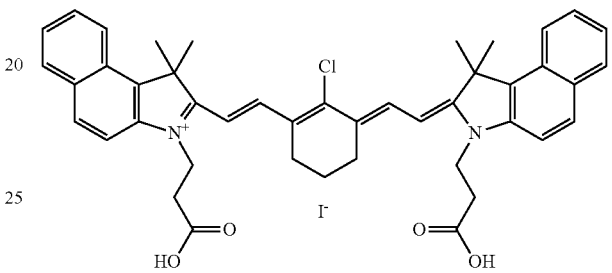

(C2)

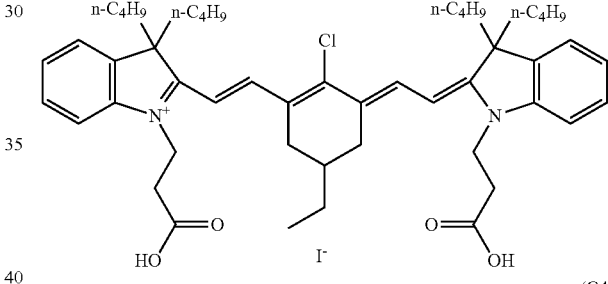

(C3)

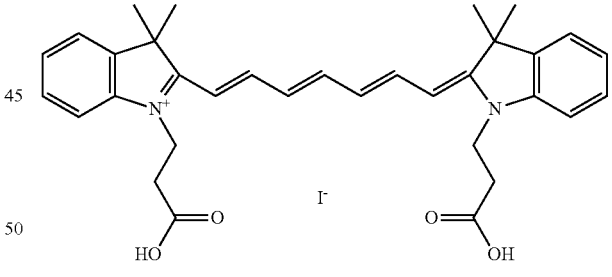

(C4)

<Measurement of Energy Conversion Efficiency>

The cell characteristics of the dye-sensitized solar cells 100 of Examples 1 to 3 and Comparative Examples 1 to 4 obtained were measured using an AM-1.5 (1000 W/m$^2$) solar simulator. The evaluation results are shown in Table 1.

The energy conversion efficiency (η: %) is expressed as a percent by sweeping the voltage of the dye-sensitized solar cell 100 by a source meter, measuring the response current, dividing the maximum output, which is the product of the voltage and the current thus obtained, by light intensity per cm$^2$, and multiplying the calculation result by 100. In other words, the energy conversion efficiency (η: %) is represented by (maximum output/light intensity per cm$^2$)×100.

<Peeling Test>

In order to evaluate the adsorption properties (adhesiveness) of the dye, a peeling test was performed. The evaluation results are shown in Table 1.

The peeling test was performed by the following procedure. First, the absorption spectrum of the surface of the dye-supported metal oxide layer 14 of the working electrode 11 of each (the measurement wavelength was in the range of 350 nm to 950 nm) was measured by an UV spectrum meter, and the initial absorbance at the peak wavelength was obtained. Next, the working electrode 11 was immersed in 100 cm$^3$ of an acetonitrile mixed liquid comprising 10% by weight of water for 2 hours, and then, the absorption spectrum was similarly measured, and the absorbance after 2-hour immersion in the 10% by weight water-containing acetonitrile at the peak wavelength was obtained. Finally, from the initial absorbance and the absorbance after 2-hour immersion in the 10% by weight water-containing acetonitrile at the peak wavelength, the dye remaining rate (%)=(the absorbance after 2-hour immersion in the 10% by weight water-containing acetonitrile/the initial absorbance)×100 was calculated. The series of absorption spectrum measurements were performed using UV-3101PC manufactured by SHIMADZU CORPORATION, with a slit width of 5 nm.

TABLE 3

|  | Example 1 | Example 2 | Example 3 | Comparative Example 1 | Comparative Example 2 | Comparative Example 3 | Comparative Example 4 |
| --- | --- | --- | --- | --- | --- | --- | --- |
| Energy conversion efficiency | 0.79 | 1.16 | 1.01 | 0.22 | 0.27 | 0.54 | 0.50 |
| Dye remaining rate | 54% | 59% | 54% | 35% | 40% | 31% | 55% |

As is clear from Table 1, it was confirmed that the dye-sensitized solar cells 100 of Examples 1 to 3 using the cyanine compounds of Synthesis Examples 1 to 3 had better energy conversion efficiency than the dye-sensitized solar cells 100 of Comparative Examples 1 to 4.

In addition, it was confirmed that the working electrodes 11 of Examples 1 to 3 tended to have a higher dye remaining rate and better energy conversion efficiency than the working electrodes 11 of Comparative Examples 1 to 3. This suggests that in the cyanine compounds of Synthesis Examples 1 to 3 in which a cyclo-ring or the like is not introduced into a heptamethine chain skeleton, steric hindrance near an anchor group is relieved, the adsorption of a —CH$_2$CH$_2$COOH group introduced into the nitrogen atom of an indolenine skeleton on a metal oxide layer is promoted, the adhesiveness is enhanced, and electron injection into a metal oxide semiconductor material is enhanced, compared with the cyanine compounds of (C1) to (C3) in which a cyclo-ring or the like is introduced into a heptamethine chain skeleton. Further, Comparative Example 4 has a high dye remaining rate, but has low energy conversion efficiency. It is suggested that the dye-sensitized solar cells 100 of Examples 1 to 3 have excellent energy conversion efficiency because R1 to R4 are each a linear alkyl group having 10 to 20 carbon atoms.

Examples 4 to 6 and Comparative Examples 5 to 8

Processing was performed as in Examples 1 to 3 and Comparative Examples 1 to 4 except that when the metal oxide layer 13 was formed by firing, a metal oxide slurry comprising a titanium oxide (TiO$_2$) powder was used instead of the zinc oxide powder, to obtain the working electrodes 11 and the dye-sensitized solar cells 100 of Examples 4 to 6 and Comparative Examples 5 to 8.

As the above metal oxide slurry comprising a titanium oxide powder, one prepared as follows was used. First, 125 cm$^3$ of titanium isopropoxide was added to 750 cm$^3$ of a 0.1 mol/dm$^3$ nitric acid aqueous solution with stirring, and the mixture was vigorously stirred at 80° C. for 8 hours. The obtained liquid was poured into a pressure vessel made of Teflon (registered trademark), and the pressure vessel was treated in an autoclave at 230° C. for 16 hours. Then, the autoclave-treated liquid (sol liquid) comprising a precipitate was resuspended by stirring. Then, this suspension was suction-filtered to remove the precipitate not resuspended, and the sol filtrate was concentrated by an evaporator until the titanium oxide concentration reached 11% by mass. After this, one drop of Triton X-100 was added to the concentrate in order to enhance wettability on the substrate. Then, a titanium oxide powder having an average particle diameter of 30 nm (P-25 manufactured by NIPPON AEROSIL CO., LTD.) was added to this sol concentrate so that the content of titanium oxide was 33% by mass as a whole, and the mixture was subjected to centrifugal stirring using rotation and revolution for 1 hour and dispersed.

The energy conversion efficiency and dye remaining rate of the dye-sensitized solar cells 100 of Examples 4 to 6 and Comparative Examples 5 to 8 obtained were measured by similar methods. The evaluation results are shown in Table 2.

TABLE 4

|  | Example 4 | Example 5 | Example 6 | Comparative Example 5 | Comparative Example 6 | Comparative Example 7 | Comparative Example 8 |
| --- | --- | --- | --- | --- | --- | --- | --- |
| Energy conversion efficiency | 0.46 | 0.51 | 0.48 | 0.13 | 0.13 | 0.26 | 0.20 |
| Dye remaining rate | 54% | 55% | 54% | 31% | 39% | 30% | 50% |

As is clear from Table 2, it was confirmed that the dye-sensitized solar cells 100 of Examples 4 to 6 using the cyanine compounds of Synthesis Examples 1 to 3 had better energy conversion efficiency than the dye-sensitized solar cells 100 of Comparative Examples 5 to 8.

In addition, it was confirmed that the working electrodes 11 of Examples 4 to 6 tended to have a higher dye remaining rate and better energy conversion efficiency than the working electrodes 11 of Comparative Examples 5 to 8. This suggests that in the cyanine compounds of Synthesis Examples 1 to 3 in which a cyclo-ring or the like is not introduced into a heptamethine chain skeleton, steric hindrance near an anchor group is relieved, the adsorption of a —CH$_2$CH$_2$COOH group introduced into the nitrogen atom of an indolenine skeleton on a metal oxide layer is promoted, the adhesiveness is enhanced, and electron injection into a metal oxide semiconductor material is enhanced, compared with the cyanine compounds of (C1) to (C3) in which a cyclo-ring or the like is introduced into a heptamethine chain skeleton. Further, Comparative Example 8 has a high dye remaining rate, but has low energy conversion efficiency. It is suggested that the dye-sensitized solar cells 100 of Examples 4 to 6 have excellent energy conversion efficiency because R1 to R4 are each a linear alkyl group having 10 to 20 carbon atoms.

Further, from the comparison of Examples 1 to 3 with Examples 4 to 6, it was confirmed that the dye-sensitized solar cells 100 of Examples 1 to 3 having the metal oxide layer 13 substantially composed of zinc oxide had substantially the same dye remaining rate but had significantly better energy conversion efficiency compared with the dye-sensitized solar cells 100 of Examples 4 to 6 having the metal oxide layer 13 substantially composed of titanium oxide.

Reference Examples 1 and 2

Processing was performed as in Example 1 except that as the dye, the following dyes (a compound D1 and a compound D2) were respectively used instead of the cyanine compound having the structure represented by chemical formula (B1) in Synthesis Example 1, to obtain the working electrodes 11 of Reference Examples 1 and 2.

[Formula 31]

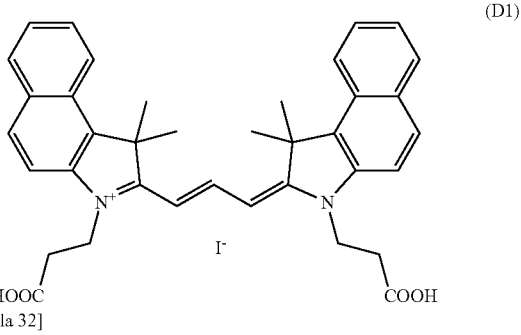

(D1)

[Formula 32]

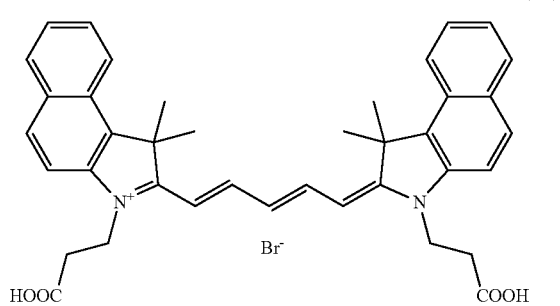

(D2)

<Measurement of Chromaticity Coordinates (x, y) in CIE Yxy Color System>

The chromaticity coordinates (x, y) in the CIE Yxy color system for the working electrodes 11 of Examples 1 to 3 using the cyanine compounds (iodides) having the structures represented by chemical formulas (B1) to (B3) and Reference Examples 1 and 2 were measured by the following procedure. The measurement results are shown in Table 3.

The chromaticity coordinates (x, y) in the CIE Yxy color system were measured by the following procedure. First, the absorption spectrum of the surface of the dye-supported metal oxide layer 14 of the working electrode 11 (the measurement wavelength was in the range of 350 nm to 850 nm) was measured by an UV spectrum meter. Then, the chromaticity coordinates (x, y) in the CIE Yxy color system were calculated by a color diagnosis program V-570 manufactured by JASCO Corporation.

TABLE 5

| | Example 1 | Example 2 | Example 3 | Reference Example 1 | Reference Example 2 |
|---|---|---|---|---|---|
| CIE Yxy color system chromaticity coordinates (x, y) | (0.31, 0.33) | (0.31, 0.33) | (0.30, 0.33) | (0.19, 0.08) | (0.26, 0.32) |

As is clear from Table 3, it was confirmed that the working electrodes 11 of Examples 1 to 3 using the cyanine compounds of Synthesis Examples 1 to 3 all exhibited a slightly light green color and were substantially colorless in visual observation.

As described above, the present invention is not limited to the above embodiment and Examples, and changes can be appropriately made without departing from the spirit thereof.

Industrial Applicability

As described above, the present invention can be widely and effectively used for electronic and electrical materials and electronic and electrical devices related to photoelectric conversion elements, such as dye-sensitized solar cells, and various apparatuses, facilities, systems, and the like comprising them.

REFERENCE SIGNS LIST

11 . . . working electrode, 12 . . . substrate, 12a . . . conductive surface, 13 . . . metal oxide layer, 14 . . . dye-supported metal oxide electrode, 21 counter electrode, 22a . . . conductive surface, 22 . . . substrate, 31 . . . electrolyte, 41 . . . spacer, 100 . . . photoelectric conversion element.

The invention claimed is:

1. A photoelectric conversion element comprising a working electrode having a dye-supported metal oxide electrode having a dye supported on a metal oxide layer, wherein the dye comprises a compound having a structure represented by the following general formula (1):

(1)

wherein:
R1 to R4 are each independently a linear alkyl group having 4 to 20 carbon atoms;
A1 and A2 are each independently selected from the following aromatic ring group A:

wherein:
(a pyrrole ring in the formula (1) is represented by an arc a to show a condensation position with the pyrrole) ring, and may have a substituent in an aromatic ring;
$An^{p-}$ is a p-valent anion;
p is 1 or 2; and
q is a coefficient for keeping a charge of the entire dye neutral.

2. The photoelectric conversion element according to claim 1, wherein in the general formula (1), A1 and A2 are each a benzene ring.

3. The photoelectric conversion element according to claim 1, wherein in the general formula (1), R1 to R4 are each a linear alkyl group having 10 to 20 carbon atoms.

4. The photoelectric conversion element according to claim 2, wherein in the general formula (1), R1 to R4 are each a linear alkyl group having 10 to 20 carbon atoms.

5. The photoelectric conversion element according to claim 1, wherein the metal oxide layer is substantially composed of zinc oxide.

6. A dye for a photoelectric conversion element, which has a structure represented by the following general formula (1):

(1)

wherein:
R1 to R4 are each independently a linear alkyl group having 4 to 20 carbon atoms;
A1 and A2 are each independently selected from the following aromatic ring group A:

wherein:
a pyrrole ring in the formula (1) is represented by an arc a to show a condensation position with the pyrrole ring, and may have a substituent in an aromatic ring;
$An^{p-}$ is a p-valent anion;
p is 1 or 2; and
q is a coefficient for keeping a charge of the entire dye neutral.

7. The dye for a photoelectric conversion element according to claim 6, wherein in the general formula (1), A1 and A2 are each a benzene ring.

8. The dye for a photoelectric conversion element according to claim 6, wherein in the general formula (1), R1 to R4 are each a linear alkyl group having 10 to 20 carbon atoms.

9. The dye for a photoelectric conversion element according to claim 7, wherein in the general formula (1), R1 to R4 are each a linear alkyl group having 10 to 20 carbon atoms.

10. The photoelectric conversion element according to claim 2, wherein the metal oxide layer is substantially composed of zinc oxide.

11. The photoelectric conversion element according to claim 3, wherein the metal oxide layer is substantially composed of zinc oxide.

12. The photoelectric conversion element according to claim 4, wherein the metal oxide layer is substantially composed of zinc oxide.

* * * * *